(12) United States Patent
Tsai et al.

(10) Patent No.: US 11,705,495 B2
(45) Date of Patent: Jul. 18, 2023

(54) MEMORY DEVICE AND METHOD OF FORMING THE SAME

(71) Applicant: Winbond Electronics Corp., Taichung (TW)

(72) Inventors: Yi-Tsung Tsai, Taichung (TW); Chih-Hao Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/325,214

(22) Filed: May 20, 2021

(65) Prior Publication Data

US 2022/0093763 A1 Mar. 24, 2022

(30) Foreign Application Priority Data

Sep. 24, 2020 (TW) .................................. 109133161

(51) Int. Cl.
| | | |
|---|---|---|
| *H01L 29/423* | (2006.01) | |
| *H01L 29/788* | (2006.01) | |
| *H01L 29/66* | (2006.01) | |
| *H01L 21/28* | (2006.01) | |
| *H10B 41/30* | (2023.01) | |

(52) U.S. Cl.
CPC .. *H01L 29/42324* (2013.01); *H01L 29/40114* (2019.08); *H01L 29/66825* (2013.01); *H01L 29/7883* (2013.01); *H10B 41/30* (2023.02)

(58) Field of Classification Search
None
See application file for complete search history.

(56) References Cited

U.S. PATENT DOCUMENTS

| | | |
|---|---|---|
| 7,652,322 B2 | 1/2010 | Choi et al. |
| 7,687,860 B2 | 3/2010 | Lee et al. |
| 8,129,797 B2 | 3/2012 | Chen et al. |
| 8,357,605 B2 | 1/2013 | Lee et al. |
| 9,252,059 B2 | 2/2016 | Xu et al. |
| 9,293,469 B2 | 3/2016 | Hong |
| 9,698,149 B2 | 7/2017 | Purayath et al. |

(Continued)

FOREIGN PATENT DOCUMENTS

| | | |
|---|---|---|
| TW | 201631710 | 9/2016 |
| TW | 201836126 | 10/2018 |

OTHER PUBLICATIONS

"Office Action of Taiwan Counterpart Application", dated Mar. 31, 2021, p. 1-p. 11.

*Primary Examiner* — Xiaoming Liu
(74) *Attorney, Agent, or Firm* — JCIPRNET

(57) ABSTRACT

Provided is a memory device including a plurality of stack structures disposed on a substrate; and a dielectric layer. Each stack structure includes a first conductive layer, a second conductive layer, an inter-gate dielectric layer, a metal silicide layer, and a barrier layer. The second conductive layer is disposed on the first conductive layer. The inter-gate dielectric layer is disposed between the first and second conductive layers. The metal silicide layer is disposed on the second conductive layer. The barrier layer is disposed between the metal silicide layer and the second conductive layer. The dielectric layer laterally surrounds a lower portion of the plurality of stack structures to expose a portion of the metal silicide layer of the plurality of stack structures.

21 Claims, 7 Drawing Sheets

(56) References Cited

U.S. PATENT DOCUMENTS

| | | | |
|---|---|---|---|
| 2001/0014522 A1* | 8/2001 | Weimer | H01L 21/28061 |
| | | | 438/653 |
| 2006/0141706 A1 | 6/2006 | Hong | |
| 2007/0111449 A1* | 5/2007 | Yu | H01L 27/11521 |
| | | | 257/E27.103 |
| 2009/0026527 A1* | 1/2009 | Ryusenji | H01L 27/11521 |
| | | | 257/E47.001 |
| 2010/0075499 A1 | 3/2010 | Olsen | |

* cited by examiner

MEMORY DEVICE AND METHOD OF FORMING THE SAME

CROSS-REFERENCE TO RELATED APPLICATION

This application claims the priority benefit of Taiwan application serial no. 109133161, filed on Sep. 24, 2020. The entirety of the above-mentioned patent application is hereby incorporated by reference herein and made a part of this specification.

BACKGROUND OF THE INVENTION

Field of the Invention

The present invention relates to a semiconductor device and a method of forming the same, and in particular to a memory device and a method of forming the same.

Description of Related Art

Non-volatile memory is currently used in various electronic devices, such as storing structural data, program data, and so on. Flash memory is a kind of non-volatile memory that can perform multiple times of data storing, reading, and erasing operations. Therefore, it has become one of the rapidly growing products in the memory market.

With the advancement of science and technology, various electronic products are developing towards the trend of lightness, thinness and compact size. Under this trend, the critical size of flash memory is also gradually shrinking, which causes the manufacturing process of flash memory to face many challenges. For example, in the process of using a metal silicide layer to reduce the resistance of the word lines, the uniformity of the metal silicide layer is often difficult to control, which leads to problems of low yield and poor reliability. Therefore, how to provide a memory device and a method of forming the same to effectively control the uniformity of the metal silicide layer will become an important issue.

SUMMARY OF THE INVENTION

The invention provides a memory device and a method of forming the same in which can improve the uniformity of the resistance of the word lines, so as to enhance the reliability and the yield.

The invention provides a memory device including a plurality of stack structures disposed on a substrate and a dielectric layer. Each stack structure includes a first conductive layer, a second conductive layer, an inter-gate dielectric layer, a metal silicide layer, and a barrier layer. The second conductive layer is disposed on the first conductive layer. The inter-gate dielectric layer is disposed between the first and second conductive layers. The metal silicide layer is disposed on the second conductive layer. The barrier layer is disposed between the metal silicide layer and the second conductive layer. The dielectric layer laterally surrounds a lower portion of the plurality of stack structures to expose a portion of the metal silicide layer of the plurality of stack structures.

The invention provides a method of forming a memory device including: forming a plurality of stack structures on a substrate, wherein each stack structure sequentially comprises: a first conductive layer, an inter-gate dielectric layer, a second conductive layer, a barrier layer, and a third conductive layer; forming a dielectric layer on the substrate to laterally surround a lower portion of the plurality of stack structures and expose a portion of the third conductive layer of the plurality of stack structures; forming a metal layer to cover the dielectric layer and the portion of the third conductive layer of the plurality of stack structures exposed by the dielectric layer; and performing a metal silicidation process to transform the third conductive layer into a metal silicide layer.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1F are schematic cross-sectional views illustrating a manufacturing process of a memory device according to an embodiment of the present invention. The memory device described in the following embodiments is taken flash memory as an example, but the invention is not limited to this.

Figure 1A:
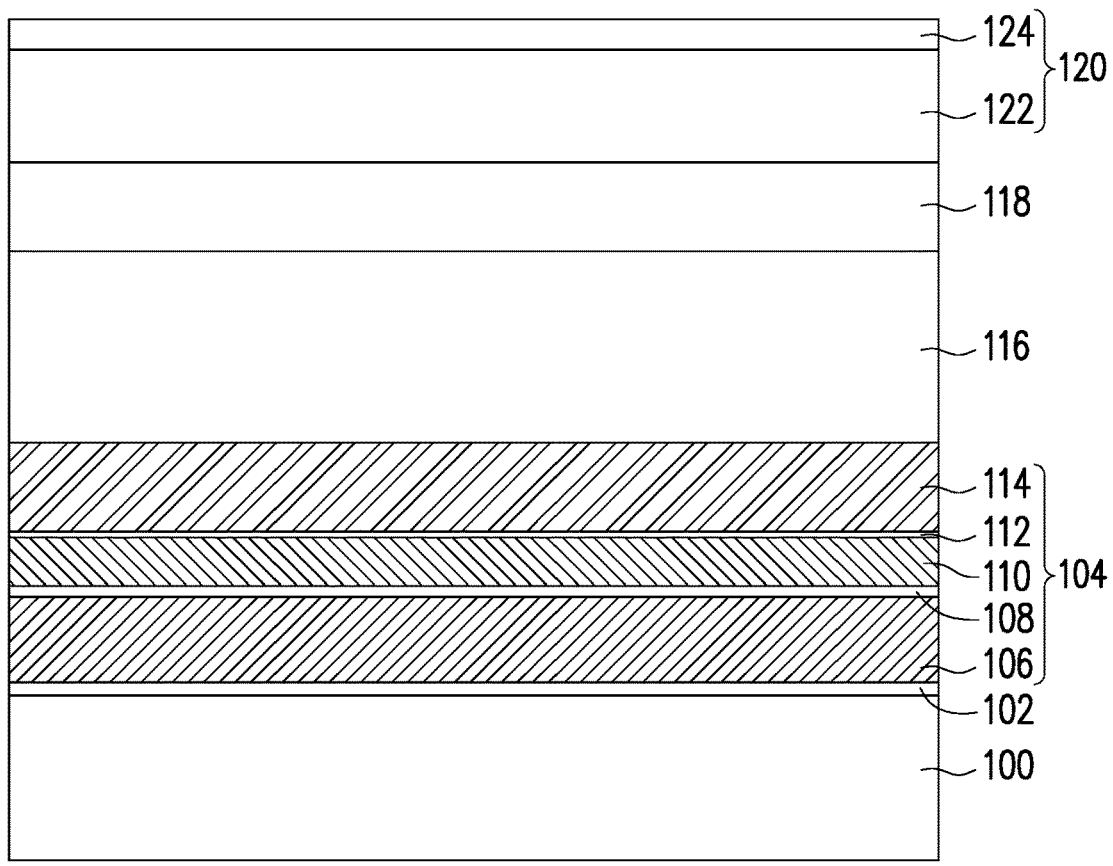
FIG. 1A to FIG. 1F are schematic cross-sectional views illustrating a manufacturing process of a memory device according to an embodiment of the present invention.

Referring to FIG. 1A, in an embodiment of the present invention, a method of manufacturing a memory device is provided to include following steps. First, a substrate 100 is provided.

Next, a tunneling dielectric layer 102 is formed on the substrate 100. In an embodiment, a material of the tunneling dielectric layer 102 may be silicon oxide, and the tunneling dielectric layer 102 may have a thickness between 3 nm and 12 nm, such as 7 nm.

Thereafter, a stack layer 104 is formed on the tunneling dielectric layer 102. Specifically, each stack layer 104 includes a first conductive layer 106, an inter-gate dielectric layer 108, a second conductive layer 110, a barrier layer 112, and a third conductive layer 114 in order from bottom to top. In an embodiment, a material of the first conductive layer 106 may be, for example, doped polysilicon, undoped polysilicon or a combination thereof; and the first conductive layer 106 may have a thickness between 70 nm and 90 nm, such as 80 nm. The inter-gate dielectric layer 108 may be, for example, a composite layer constituted of Nitride/Oxide/Nitride/Oxide/Nitride (NONON), but the invention is not limited thereto, the composite layer may be three, five or more layers. and may have thickness between 9 nm and 16 nm, such as 14.5 nm. A material of the second conductive layer 110 may be, for example, doped polysilicon, undoped polysilicon, or a combination thereof; and the second conductive layer 110 may have a thickness between 25 nm and 35 nm, such as 30 nm. A material of the barrier layer 112 may be, for example, Ti, TiN, Ta, TaN, or a combination thereof; an atomic layer deposition, etc.; and the barrier layer 112 may have a thickness between 5 nm and 15 nm, such as 10 nm. A material of the third conductive layer 114 may be, for example, doped polysilicon, undoped polysilicon, or a combination thereof; and the third conductive layer 114 may have a thickness between 80 nm and 120 nm, such as 90 nm. In the embodiment, the first conductive layer 106, the second conductive layer 110, and the third conductive layer 114 have the same material, such as doped polysilicon. In addition, the thickness of the third conductive layer 114 may be greater than the thickness of the second conductive layer 110.

Then, an oxide layer 116, a polysilicon layer 118, and a hard mask layer 120 are sequentially formed on the stack layer 104. In one embodiment, a material of the oxide layer 116 may be, for example, tetraethoxysilane (TEOS); and the oxide layer 116 may have a thickness between 160 nm and 200 nm, such as 170 nm. A material of the polysilicon layer 118 may be, for example, tensile polysilicon; and the polysilicon layer 118 may have a thickness between 70 nm and 90 nm, such as 80 nm. The hard mask layer 120 may include a carbide layer 122 and an anti-reflection layer 124 on the carbide layer 122. A material of the carbide layer 122 may be spin-on-carbon (SoC), and the carbide layer 122 may have a thickness between 120 nm and 200 nm, such as 165 nm. A material of the anti-reflective layer 124 may be, for example, silicon oxynitride, and anti-reflective layer 124 may have a thickness between 15 nm and 40 nm, such as 27 nm.

Figure 1B:
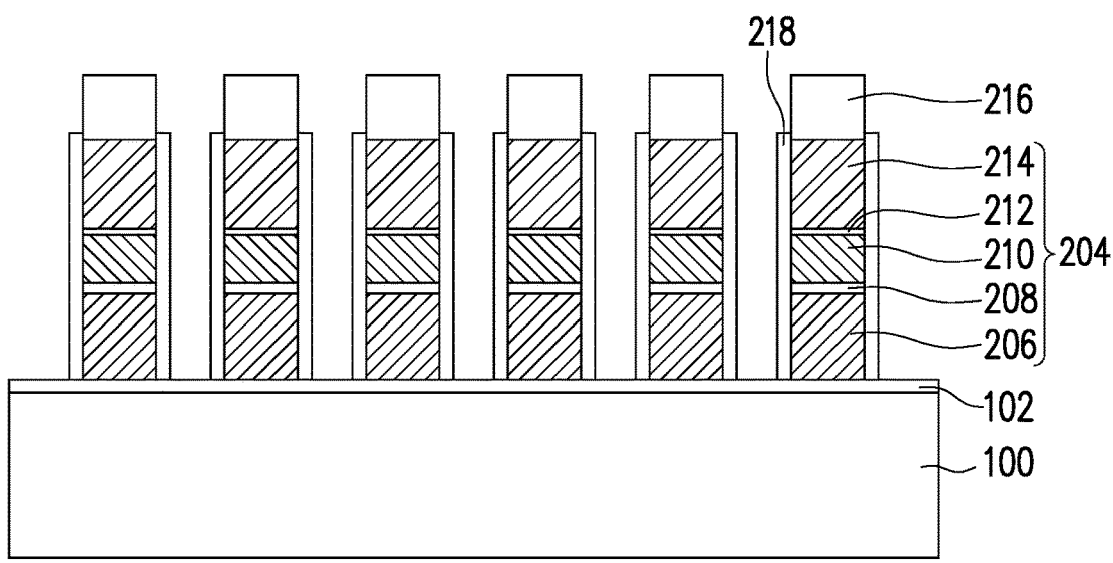

Referring to FIG. 1A and FIG. 1B, a self-aligning double patterning (SADP) process is performed to pattern the stack layer 104 into a plurality of stack structures 204. The detailed steps of the above-mentioned self-aligning double patterning process should be well known to those with ordinary knowledge in the art, and will not be detailed here. In alternative embodiments, a self-aligning quadruple patterning (SAQP) process may also be performed to pattern the stack layer 104 into the stack structures with a higher pattern density.

In detail, as shown in FIG. 1B, each stack structure 204 includes a first conductive layer 206, an inter-gate dielectric layer 208, a second conductive layer 210, a barrier layer 212, and a third conductive layer 214 in order from bottom to top. The materials and thicknesses of the first conductive layer 206, the inter-gate dielectric layer 208, the second conductive layer 210, the barrier layer 212, and the third conductive layer 214 are the same as those of the first conductive layer 106, the inter-gate dielectric layer 108, the second conductive layer 110, the barrier layer 112, and the third conductive layer 114 described above, and will not be repeated here. In the embodiment, the first conductive layer 206 may be used as a floating gate (FG); the second conductive layer 210 may be used as a control gate (CG); the third conductive layer 214 may be used to form a subsequent metal silicide layer 234 (as shown in FIG. 1F); and the entire stack structure 204 may be used as a word line. After the self-aligning double patterning process is performed, a plurality of cap layers 216 and a plurality of spacers 218 are further included. The cap layers 216 are respectively disposed on the stack structures 204. The spacers 218 are respectively disposed on sidewalls of the stack structures 204.

Figure 1C:
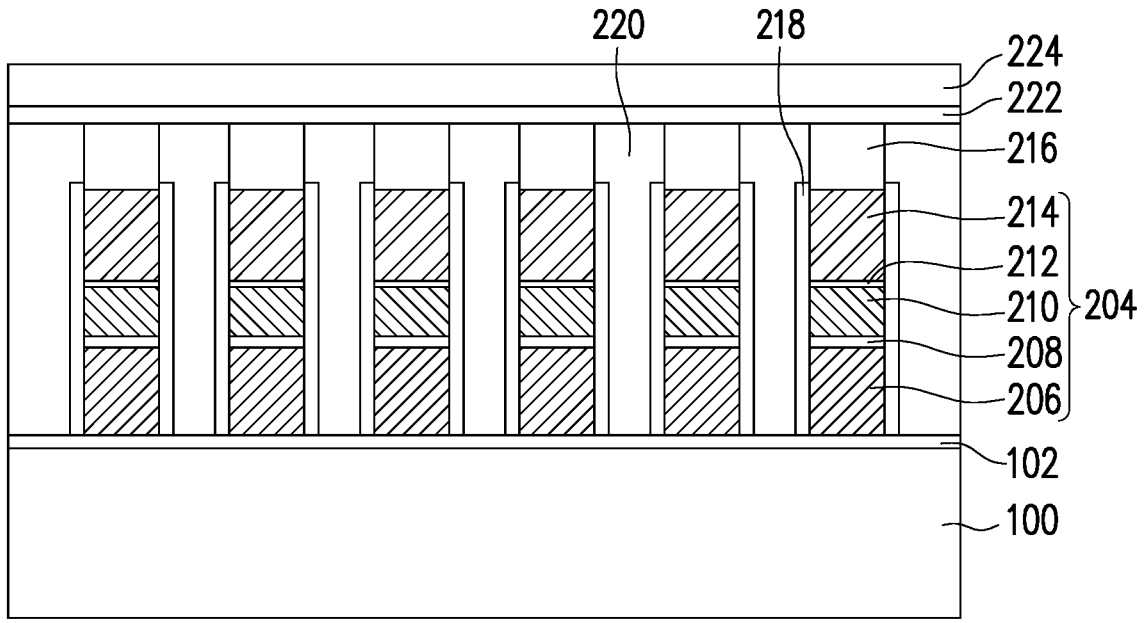

Referring to FIG. 1C, a dielectric layer 220 is formed between the stack structures 204. The dielectric layer 220 laterally surrounds the stack structures 204 and the cap layers 216. In one embodiment, a material of the dielectric layer 220 may be, for example, tetraethoxysilane (TEOS), and the dielectric layer 220 may be formed by forming a dielectric material via a chemical vapor deposition, and then removing a portion of the dielectric material via a chemical mechanical polishing (CMP) process. In the embodiment, a top surface of the dielectric layer 220 may be substantially coplanar with a top surface of the cap layers 216.

Thereafter, an oxide layer 222 and a nitride layer 224 are sequentially formed on the dielectric layer 220. The oxide layer 222 covers the top surface of the dielectric layer 220 and the top surface of the cap layers 216. In an embodiment, a material of the oxide layer 222 may be, for example, tetraethoxysilane (TEOS); and the oxide layer 222 may have a thickness between 7 nm and 15 nm. A material of the nitride layer 224 may be, for example, silicon nitride; and the nitride layer 224 may have a thickness between 15 nm and 25 nm.

Figure 1D:
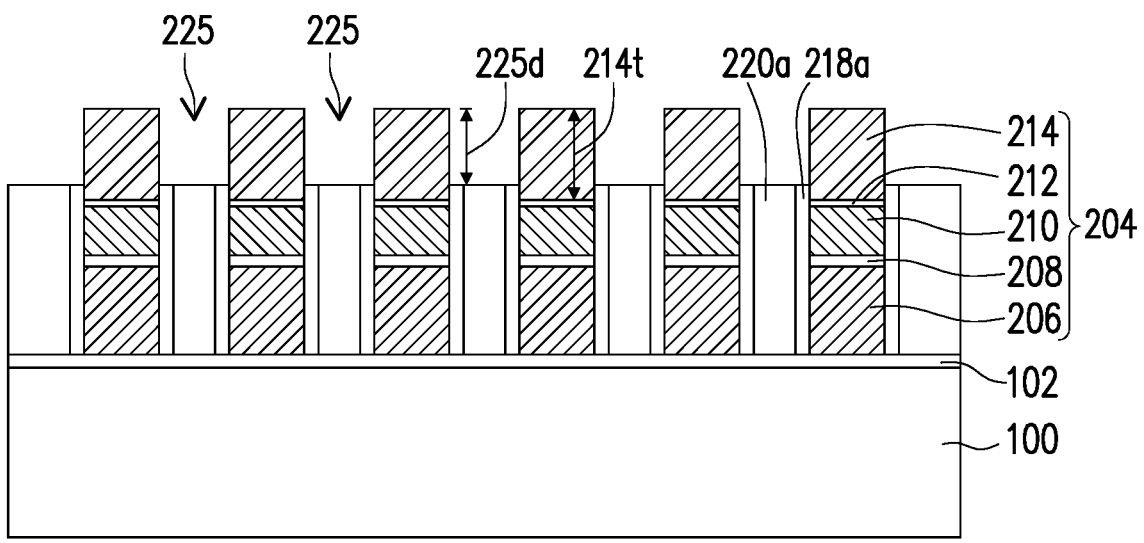

Referring to FIG. 1C and FIG. 1D, a chemical mechanical polishing (CMP) process is performed to remove the nitride layer 224 and the oxide layer 222, thereby exposing the top surface of the cap layers 216 and/or the top surface of the dielectric layer 220. Then, an etching back process is performed to remove the cap layers 216, a portion of the spacers 218, and a portion of the dielectric layer 220, so as to form a recess 225 between the stack structures 204. In one embodiment, the etching back process includes a plurality of etching steps. For example, the etching back process includes a first etching step to remove the cap layers 216, a second etching step to remove the spacers 218, and a third etching step to remove the dielectric layer 220. The first etching step, the second etching step, and the third etching step may be performed in different orders. In the above-mentioned etching back process, the dielectric layer 220 (or spacers 218) and the third conductive layer 214 have a high etching selectivity ratio. In other words, in the above-mentioned etching back process, an etching rate of the dielectric layer 220 or the spacers 218 is greater than an etching rate of the third conductive layer 214. Therefore, most of the dielectric layer 220 and spacers 218 are removed, but the third conductive layer 214 is not removed or only a small amount of the third conductive layer 214 is removed, as shown in FIG. 1D. In the embodiment, during the etching back process, an etching selectivity ratio of the dielectric layer 220 (or spacers 218) to the third conductive layer 214 is greater than 100:1.

After the etching back process is performed, as shown in FIG. 1D, the dielectric layer 220a laterally surrounds a lower portion of the stack structures 204 and exposes a top surface and a portion of a sidewall of the third conductive layer 214. The spacers 218a are located between the lower portion of the stack structures 204 and the dielectric layer 220a. In other words, the spacers 218a also cover the lower portion of the stack structures 204 and expose the top surface and the portion of the sidewall of the third conductive layer 214. In one embodiment, a top surface of the spacers 218a and a top surface of the dielectric layer 220a are substantially coplanar. However, the present invention is not limited thereto, in other embodiments, the top surface of the spacers 218a may be higher or lower than the top surface of the dielectric layer 220a according to the type of etchant used in the above-mentioned etching back process.

It should be noted that the top surface of the dielectric layer 220a is at least higher than a top surface of the barrier layers 212, so as to prevent the second conductive layer 210 under the barrier layer 212 from being silicided by the subsequent metal silicidation process. From another perspective, a bottom surface of the recess 225 is at least higher than the top surface of the barrier layers 212. In an embodiment, a depth 225d of the recess 225 may be between 60 nm and 75 nm, such as 65 nm. In other embodiments, a ratio of the depth 225d of the recess 225 to a thickness 214t of the third conductive layer 214 may be greater than two-thirds, so that the third conductive layer 214 can be fully metal silicided by the subsequent metal silicidation process.

Figure 1E:
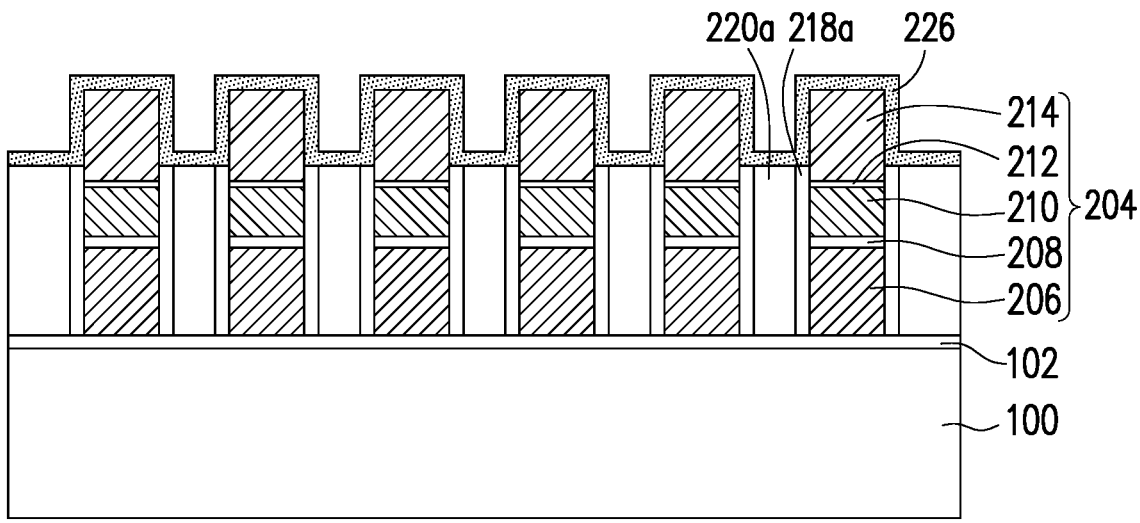
Figure 1F:
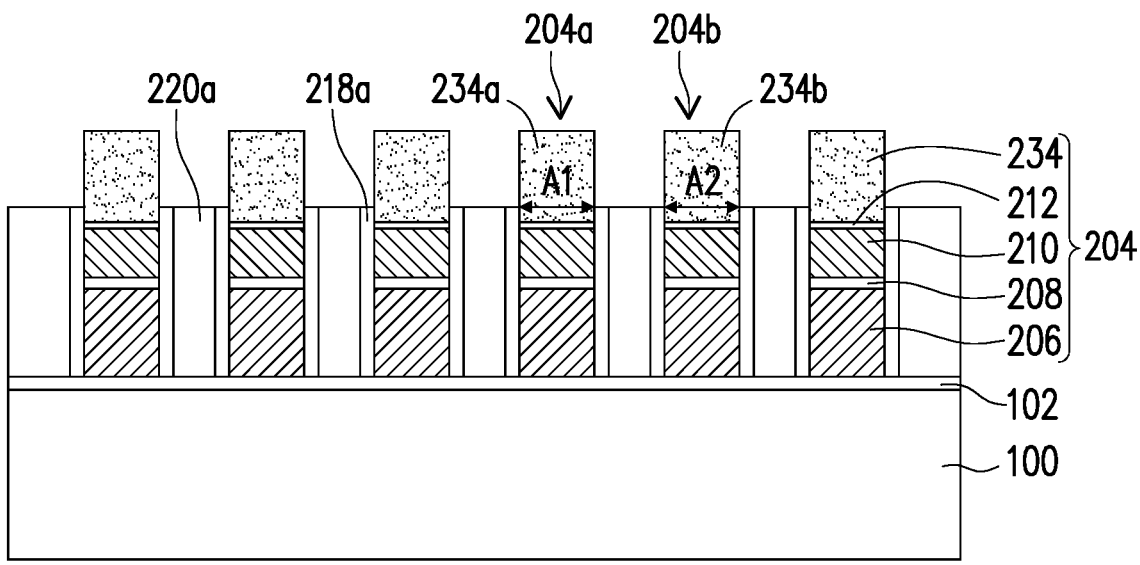

Referring to FIG. 1E, a metal layer 226 is formed. The metal layer 226 conformally covers the top surface of the spacers 218a, the top surface of the dielectric layer 220a, and the top surface and a portion of the sidewall of the third conductive layer 214 exposed by the dielectric layer 220a. In an embodiment, the metal layer 226 includes a single-layered structure, a bi-layered structure, or a multi-layered structure. For example, when the metal layer 226 is the bi-layered structure, the bi-layered structure includes a first metal material and a second metal material with different materials. The first metal material may contact the third conductive layers 214, and may include tungsten, titanium, cobalt, tantalum, nickel, platinum, palladium, molybdenum, or a combination thereof, such as cobalt. The second metal material is disposed on the first metal material and covers the first metal material to prevent oxidation of the first metal material. The second metal material includes TiN, TaN, ZrN, WN or a combination thereof, such as TiN. On the other hand, when the metal layer 226 is the single-layered structure, a material of the metal layer 226 may be, for example, a metal material such as tungsten, titanium, cobalt, tantalum, nickel, platinum, palladium, molybdenum or a combination thereof. However, the present invention is not limited thereto, in other embodiments, as long as the metal layer which can react with the third conductive layer 214 (i.e., polysilicon material) to form the metal silicide layer falls within the scope of the present invention.

Referring to FIG. 1E and FIG. 1F, a metal silicidation process is performed to transform the third conductive layer 214 into a metal silicide layer 234. In the embodiment, the third conductive layer 214 can be completely transformed into the metal silicide layer 234, and the metal silicide layer 234 is in direct contact with the barrier layer 212. It should be noted that the barrier layer 212 can be used as a blocking layer in the metal silicidation process, so that the overlying third conductive layer 214 is fully metal silicided, while avoiding the underlying second conductive layer 210 from being metal silicided. In the case, as shown in FIG. 1F, the metal silicide layer 234 of each stack structure 204 has substantially the same shape. Specifically, the stack structures 204 include a first stack structure 204a and a second stack structure 204b. A first metal silicide layer 234a of the first stack structure 204a has a first bottom area A1, and a second metal silicide layer 234b of the second stack structure 204b has a second bottom area A2 that is substantially equal to the first bottom area A1. Based on the above, in the embodiment of the present invention, the barrier layers 212 are used to improve the uniformity of the metal silicide layers 234, so as to improve the uniformity of the resistance of the word lines (i.e., stack structures 204), thereby increasing the reliability and the yield.

FIG. 2A to FIG. 2D are schematic cross-sectional views illustrating a metal silicidation process according to an embodiment of the present invention.

Figure 2A:
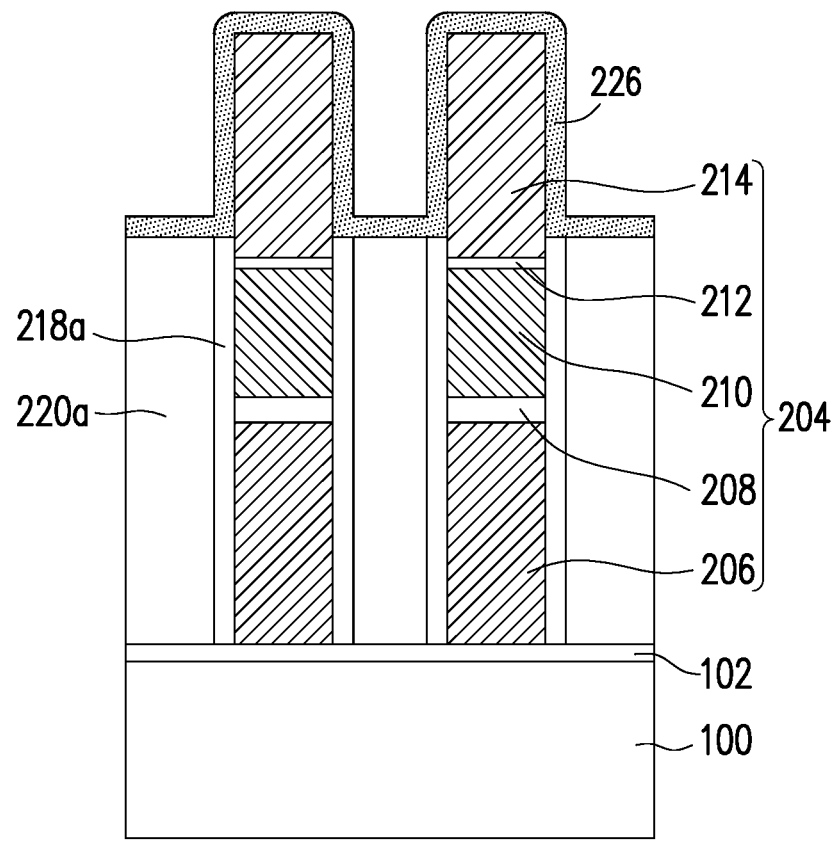
FIG. 2A to FIG. 2D are schematic cross-sectional views illustrating a metal silicidation process according to an embodiment of the present invention.

Referring to FIG. 2A, in an embodiment of the present invention, a metal silicidation process is provided to including follow steps. First, a metal layer 226 is conformally formed to cover the top surface of the dielectric layer 220a and the top surface and a portion of the sidewall of the third conductive layer 214 exposed by the dielectric layer 220a. The structure of FIG. 2A corresponds to the structure of FIG. 1E, and the same components have been described in the above paragraphs, and will not be repeated here.

Figure 2B:
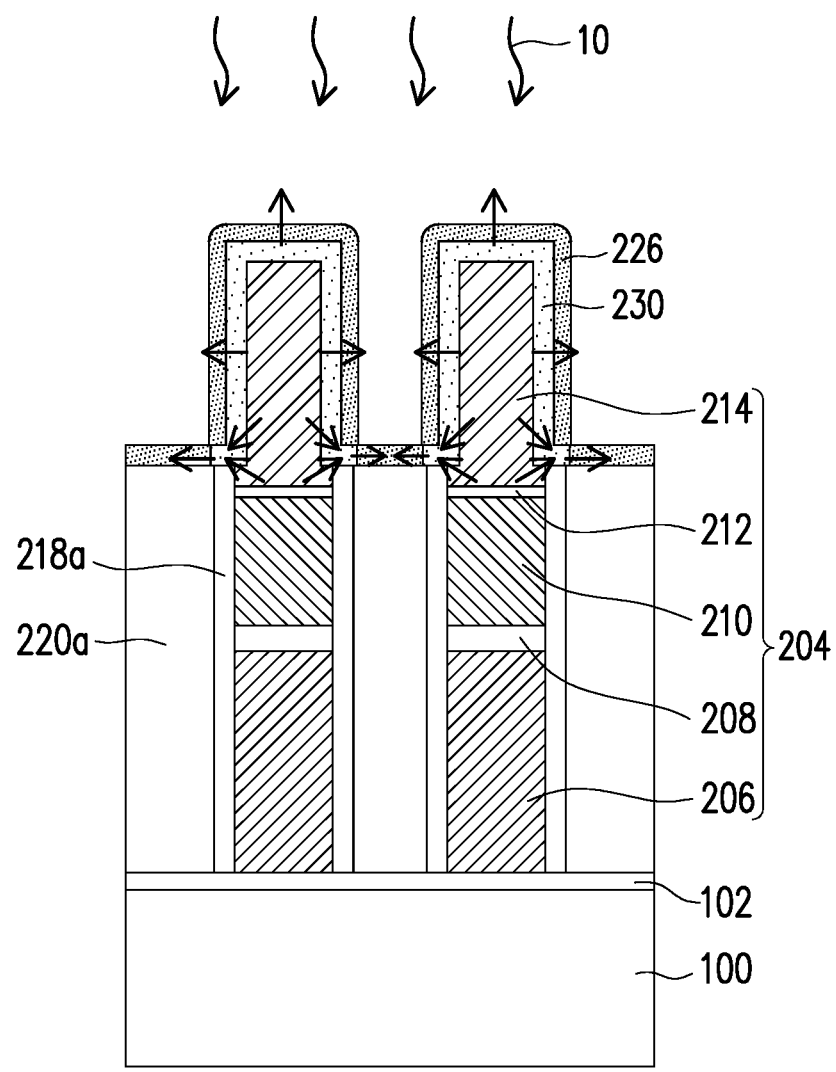

Referring to FIG. 2B, a first heat treatment 10 is performed to convert the metal layer 226 and a first portion of the third conductive layer 214 in contact with the metal layer 226 into a first metal silicide material 230. Specifically, when the metal layer 226 is a cobalt layer and the third conductive layer 214 is a polysilicon layer, in the first heat treatment 10, Si in the polysilicon layer 214 will diffuse to a contact surface of the cobalt layer 226 and the polysilicon layer 214, so as to form a cobalt silicide ($Co_2Si/CoSi$) 230 with a high resistance phase. In one embodiment, the first heat treatment 10 may be a rapid thermal annealing (RTA), which has a temperature between 300° C. and 600° C. and a time between 10 seconds and 20 seconds.

Figure 2C:
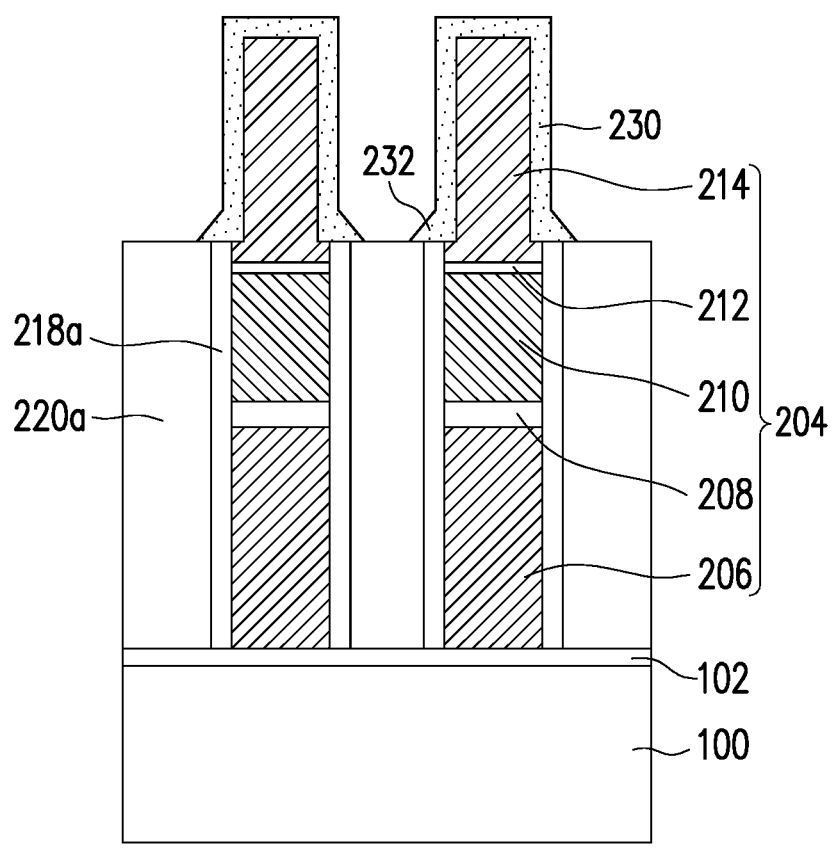

Referring to FIG. 2B and FIG. 2C, an etching process is performed to remove the unreacted metal layer 226. the etching process includes a wet etching process. It should be noted that since Si in the polysilicon layer 214 diffuses into the cobalt layer 226 to form the cobalt silicide 230 with the high resistance phase, the high-resistance phase cobalt silicide 230 has an extending portion 232 that extends to cover the top surface of the spacers 218a and a portion of the top surface of the dielectric layer 220a, as shown in FIG. 2C.

Figure 2D:
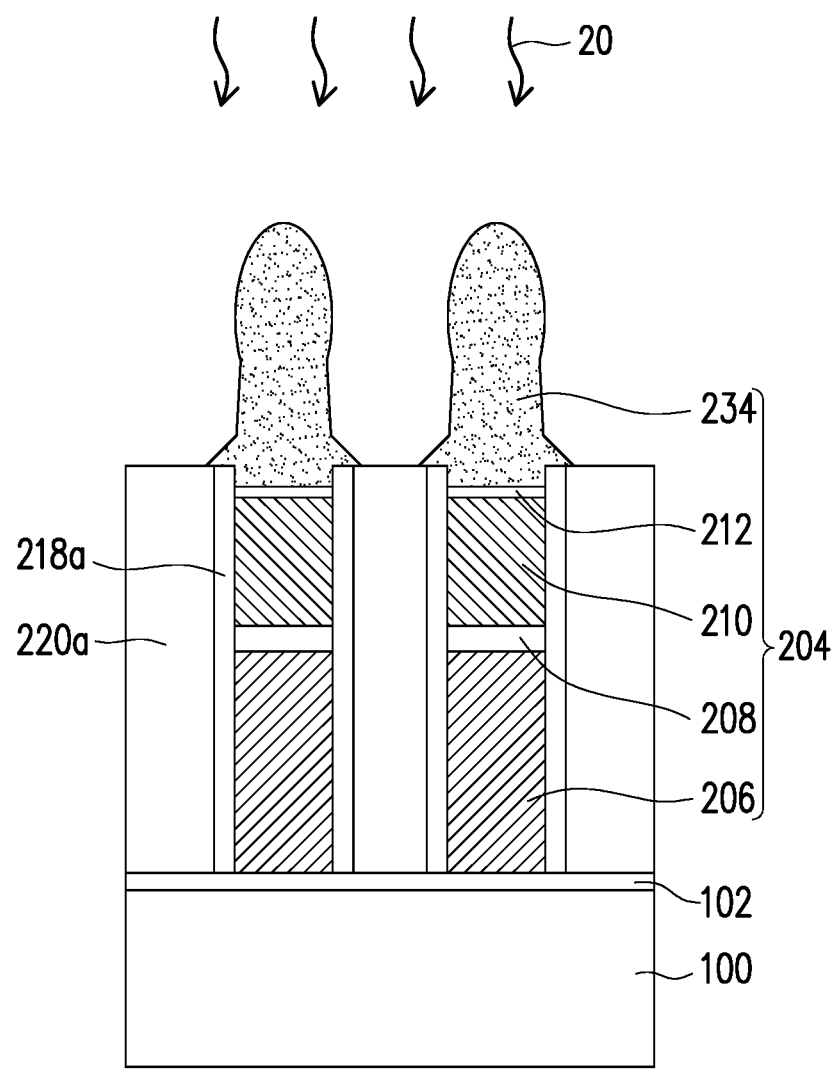

Referring to FIG. 2D, after removing the unreacted metal layer 226, a second heat treatment 20 is performed to convert the first metal silicide material 230 and a second portion of the third conductive layers 214 in contact with the first metal silicide material 230 into a second metal silicide material 234. Herein, the second metal silicide material 234 may be regarded as the metal silicide layer 234 of FIG. 1F. The dielectric layer 220a laterally surrounds the lower portion of the stack structures 204 to expose a portion of the metal silicide layer 234 of the stack structures 204. In the embodiment, a resistance of the second metal silicide material 234 is lower than a resistance of the first metal silicide material 230. Specifically, when the metal layer 226 is a cobalt layer and the third conductive layer 214 is a polysilicon layer, in the second heat treatment 20, Si in the polysilicon layer 214 may further diffuses into the high-resistance cobalt silicide 230, so that the high-resistance cobalt silicide 230 is transformed into a cobalt silicide ($CoSi_2$) 234 with a low resistance phase. In one embodiment, the second heat treatment 20 may be a rapid thermal annealing (RTA), which has a temperature between 650° C. and 850° C. and a time between 30 seconds and 90 seconds. In the embodiment, the temperature of the second heat treatment 20 is higher than the temperature of the first heat treatment 10, and the time of the second heat treatment 20 is greater than the time of the first heat treatment 10.

In addition, during the second heat treatment 20, the first metal silicide material 230 covers the top surface and the upper sidewall of the third conductive layer 214. In this case, the upper portion of the formed second metal silicide material 234 has a tapered shape. In other words, the second metal silicide material 234 has a tapered sidewall in an extending direction from bottom to top (i.e., an extending direction from the substrate 100 to the metal silicide layer 234).

In summary, in the embodiment of the present invention, a barrier layer is formed between two polysilicon layers, and the barrier layer is used as a blocking layer in the metal silicidation process, so that the overlying polysilicon layer is fully metal silicided, while avoiding the underlying polysilicon layer from being metal silicided. Therefore, the metal silicide layer of each word-line structure is able to have substantially the same shape, so as to improve the uniformity of the resistance of the word lines, thereby improving the reliability and the yield.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A memory device, comprising:
a plurality of stack structures disposed on a substrate, wherein each stack structure comprises:
a first conductive layer;
a second conductive layer, disposed on the first conductive layer;
an inter-gate dielectric layer, disposed between the first and second conductive layers;
a metal silicide layer, disposed on the second conductive layer; and
a barrier layer, disposed between the metal silicide layer and the second conductive layer; and
a dielectric layer, laterally surrounding a lower portion of the plurality of stack structures to expose a portion of the metal silicide layer of the plurality of stack structures,
a plurality of spacers, respectively disposed between the plurality of stack structures and the dielectric layer;
wherein the metal silicide layer extends to cover a top surface of the spacers and a portion of a top surface of the dielectric layer.

2. The memory device according to claim 1, wherein the dielectric layer has a top surface higher than a top surface of the barrier layer.

3. The memory device according to claim 1, wherein a material of the barrier layer comprises Ti, TiN, Ta, TaN, or a combination thereof.

4. The memory device according to claim 1, further comprising:
a tunneling dielectric layer, disposed between the substrate and the plurality of stack structures, and between the substrate and the dielectric layer.

5. The memory device according to claim 4, wherein the plurality of spacers cover the lower portion of the plurality of stack structures.

6. The memory device according to claim 1, wherein the metal silicide layer is in direct contact with the barrier layer.

7. The memory device according to claim 1, wherein the plurality of stack structures comprises a first stack structure and a second stack structure, a first metal silicide layer of the first stack structure has a first bottom area, a second metal silicide layer of the second stack structure has a second bottom area, and the first bottom area is substantially equal to the second bottom area.

8. The memory device according to claim 1, wherein the metal silicide layer has a sidewall tapering along a direction from the substrate to the metal silicide layer.

9. The memory device according to claim 1, wherein a material of the first and second conductive layers comprises a doped polysilicon, an undoped polysilicon, or a combination thereof.

10. The memory device according to claim 1, wherein the metal silicide layer is in direct contact with the top surface of the spacers.

11. A method of forming a memory device, comprising:
forming a plurality of stack structures on a substrate, wherein each stack structure sequentially comprises: a first conductive layer, an inter-gate dielectric layer, a second conductive layer, a barrier layer, and a third conductive layer;
forming a dielectric layer on the substrate to laterally surround a lower portion of the plurality of stack structures and expose a portion of the third conductive layer of the plurality of stack structures;
respectively forming a plurality of spacers between the plurality of stack structures and the dielectric layer;
forming a metal layer to cover the dielectric layer and the portion of the third conductive layer of the plurality of stack structures exposed by the dielectric layer; and
performing a metal silicidation process to transform the third conductive layer into a metal silicide layer,
wherein the metal silicide layer extends to cover a top surface of the spacers and a portion of a top surface of the dielectric layer.

12. The method of forming the memory device according to claim 11, wherein the third conductive layer is fully transformed into the metal silicide layer, and the metal silicide layer is in direct contact with the barrier layer.

13. The method of forming the memory device according to claim 11, wherein a material of the first, second, and third conductive layers comprises a doped polysilicon, an undoped polysilicon, or a combination thereof.

14. The method of forming the memory device according to claim 11, wherein the forming the plurality of stack structures comprises:
forming a stack layer; and
performing a self-aligning double patterning (SADP) process to pattern the stack layer into the plurality of stack structures.

15. The method of forming the memory device according to claim 11, further comprising:
forming a tunneling dielectric layer between the substrate and the plurality of stack structures, and between the substrate and the dielectric layer.

16. The method of forming the memory device according to claim 15, wherein the plurality of spacers cover the lower portion of the plurality of stack structures.

17. The method of forming the memory device according to claim 11, wherein the performing the metal silicidation process comprises:
performing a first heat treatment to convert the metal layer and a first portion of the third conductive layer being in contact therewith into a first metal silicide material;
performing an etching process to remove an unreacted metal layer;
performing a second heat treatment to convert the first metal silicide material and a second portion of the third conductive layer being in contact therewith into a second metal silicide material, wherein the second metal silicide material has a resistance lower than a resistance of the first meta silicide material.

18. The method of forming the memory device according to claim 17, wherein a temperature of the second heat treatment is higher than a temperature of the first heat treatment.

19. The method of forming the memory device according to claim 11, wherein the metal layer comprises a single-layered structure, a bi-layered structure, or a multi-layered structure.

20. The method of forming the memory device according to claim 11, wherein when the metal layer is a bi-layered structure, the bi-layered structure comprises:
a first metal material contacting the third conductive layer, and comprising tungsten, titanium, cobalt, tantalum, nickel, platinum, palladium, molybdenum or a combination thereof; and
a second metal material disposed on the first metal material, and comprising TiN, TaN, ZrN, WN, or a combination thereof.

21. The method of forming the memory device according to claim 11, wherein the metal silicide layer is in direct contact with the top surface of the spacers.

* * * * *